United States Patent
Onizuka

(12) 
(10) Patent No.: US 6,325,635 B1
(45) Date of Patent: Dec. 4, 2001

(54) CIRCUIT CONNECTION STRUCTURE FOR ELECTRIC CONNECTION BOX AND CIRCUIT FORMING METHOD

(75) Inventor: Takahiro Onizuka, Nagoya (JP)

(73) Assignees: Autonetworks Technologies, Ltd., Aichi; Sumitomo Wiring Systems, Ltd., Mie; Sumitomo Electric Industries, Ltd., Osaka, all of (JP)

( * ) Notice: Subject to any disclaimer, the term of this patent is extended or adjusted under 35 U.S.C. 154(b) by 0 days.

(21) Appl. No.: 09/703,840

(22) Filed: Nov. 2, 2000

(30) Foreign Application Priority Data

Nov. 10, 1999 (JP) .................................................. 11-320176

(51) Int. Cl.$^7$ .................................................. H01R 29/00
(52) U.S. Cl. ............................................. 439/49; 439/949
(58) Field of Search ........................... 439/76.2, 49, 212, 439/723, 724, 949, 404

(56) References Cited

U.S. PATENT DOCUMENTS

| | | | |
|---|---|---|---|
| 5,057,026 | * | 10/1991 | Sawai et al. ............................ 439/76 |
| 5,718,598 | * | 2/1998 | Saka et al. ............................ 439/404 |
| 5,729,436 | * | 3/1998 | Yoshigi et al. ................. 439/76.2 X |
| 5,877,944 | * | 3/1999 | Onizuka ............................. 439/76.2 |
| 5,888,088 | * | 3/1999 | Kobayashi et al. .................. 439/404 |
| 5,902,138 | * | 5/1999 | Murakami ........................... 439/76.2 |
| 6,168,470 | * | 1/2001 | Ikeda et al. .......................... 439/621 |

FOREIGN PATENT DOCUMENTS 11-180649   7/1999   (JP) .

* cited by examiner

Primary Examiner—Brian Sircus
Assistant Examiner—Son V. Nguyen
(74) Attorney, Agent, or Firm—Oliff & Berridge, PLC

(57) ABSTRACT

Circuits are provided by fixing straight bus bars on an insulation plate, fixing tub terminals at the side part with respect to the bus bars, and bonding the tub terminals and the bus bars with wires with an insulation coat.

3 Claims, 5 Drawing Sheets

CIRCUIT CONNECTION STRUCTURE FOR ELECTRIC CONNECTION BOX AND CIRCUIT FORMING METHOD

BACKGROUND OF THE INVENTION

1. Field of the Invention

The present invention relates to a circuit connection structure for an electric connection box and a circuit forming method.

2. Description of the Related Art

Electric connection boxes for the multipoint connection of various kinds of the electric equipment such as wire harnesses for automobiles are used for reasonable and economical multipoint connection of wirings with the multipoint connection points provided at one point. Various types have been developed according to the trend toward the higher density of wire harnesses, depending on the kind of the automobile or the application.

Bus bars to be stored in the electric connection box are provided by punching out plural kinds of bus bars from a hoop material with a press mold, cutting up tub terminals each from the pattern part of each bus bar, providing an insulation plate between the bus bars, and storing the same in the electric connection box.

However, since the above-mentioned bus bars have different shapes in the pattern part so that they need to be punched out with a press mold dedicated to each of them, problems such as a high production cost and the lack of flexibility due to difference in the bus bar pattern part shape for the electric connection boxes for the same kind of automobiles but of different grades arise.

Japanese Patent Application No. 11-180649, corresponding to U.S. Pat. Ser. No. 09/520,186, describes a connection structure for bus bars, capable of electrically connecting the bus bars on both surfaces by disposing a vertical direction bus bar on one surface of an insulation plate and disposing a lateral direction bus bar on the other surface of the insulation plate, fitting with a through hole of the insulation plate a dent part of at least one of the bus bars at an appropriate position of the intersection part of the bus bars on both surfaces, and welding the dent part in the state contacting with the bus bar on the surface facing thereto.

According to the related art, since the bus bars can be provided by disposing the common straight vertical direction bus bar and lateral direction bus bar in a combination, and welding the dent part at the intersection part for connecting the upper layer and lower layer bus bars, unlike the conventional configuration, the bus bars need not be provided by punching out with dedicated press molds for different pattern shapes so that the production cost can be reduced. Moreover, since any bus bar pattern shape can be dealt with only by changing the position of the dent part, effects such as drastic cutback of the number of the circuit design steps as well as capability of dealing with design change derived from a slight circuit modification quickly so as to improve the flexibility can be achieved.

SUMMARY OF THE INVENTION

This invention relates to improvement on circuit connection structure and circuit forming method according to the proposal by the inventor, and an object thereof is to provide a circuit connection structure for an electric connection box and a circuit forming method with a better flexibility, capable of further reducing the production cost.

In order to solve the problems, a first aspect of the invention is a connection structure for a circuit stored in an electric connection box, wherein the circuit is provided by fixing a plurality of bus bars elongating straightly in the same direction with an interval, on an insulation plate, fixing a plurality of tub terminals elongating in the direction perpendicular to the bus bar elongation direction with an interval at the side part with respect to the bus bars on the insulation plate, and bonding the tub terminals and the bus bars with wires with an insulation coat.

Moreover, a second aspect of the invention is a method for forming a circuit stored in an electric connection box, wherein the circuit is provided by fixing a plurality of bus bars elongating straightly in the same direction with an interval, on an insulation plate, fixing a plurality of tub terminals elongating in the direction perpendicular to the bus bar elongation direction with an interval at the side part with respect to the bus bars on the insulation plate, and bonding the tub terminals and the bus bars with wires with an insulation coat.

According to the invention, a circuit is provided by fixing a plurality of straight bus bars on an insulation plate as well as fixing a plurality of tub terminals at the side part with respect to the bus bars, and bonding the tub terminals and the bus bars with wires with an insulation coat.

DETAILED DESCRIPTION OF THE PRESENT INVENTION

Hereinafter, an embodiment of the invention will be explained in detail with reference to the drawings.

Figure 1:
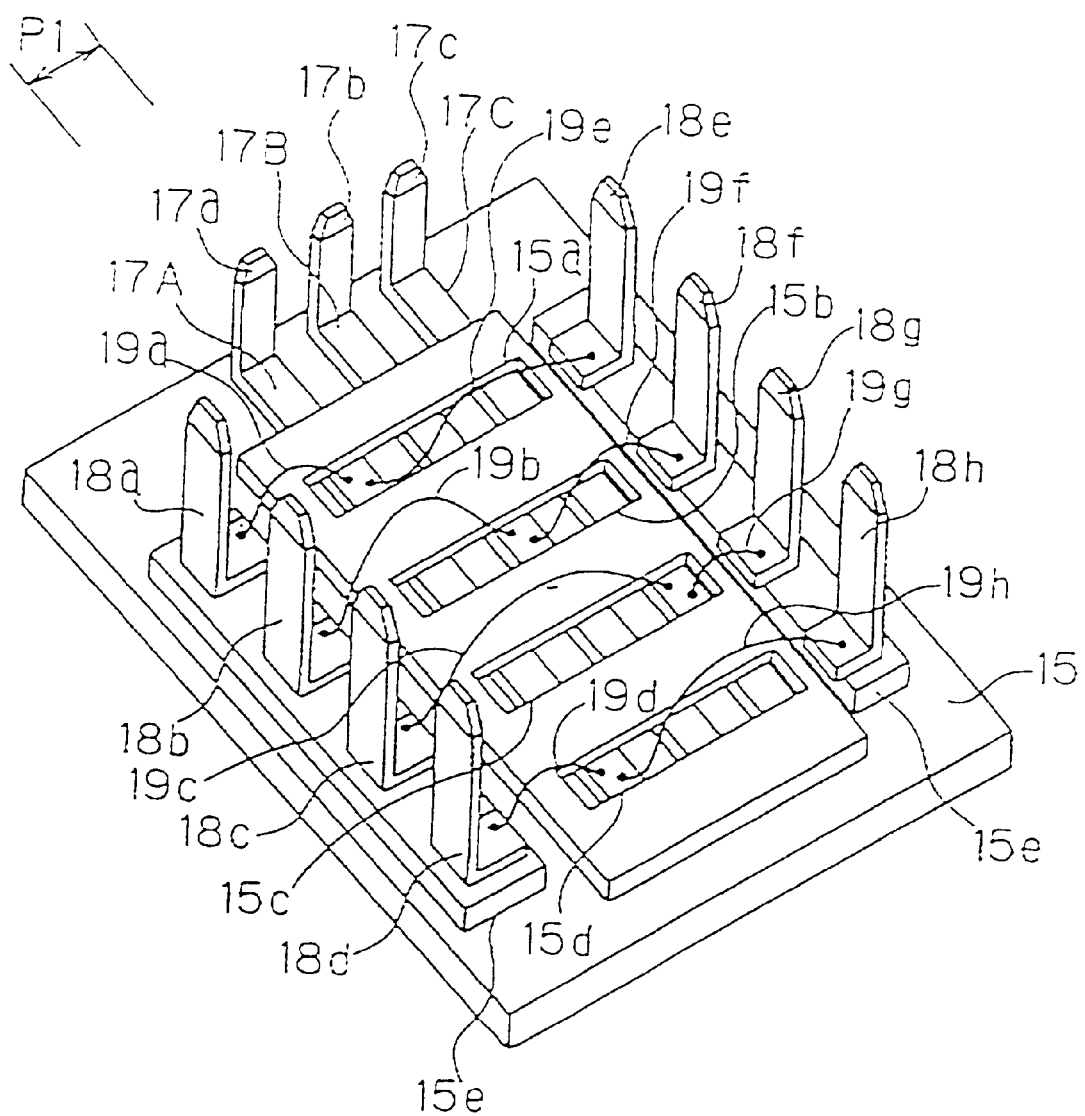
FIG. 1 is a perspective view of a bus bar connection structure according to the invention.
Figure 2A:
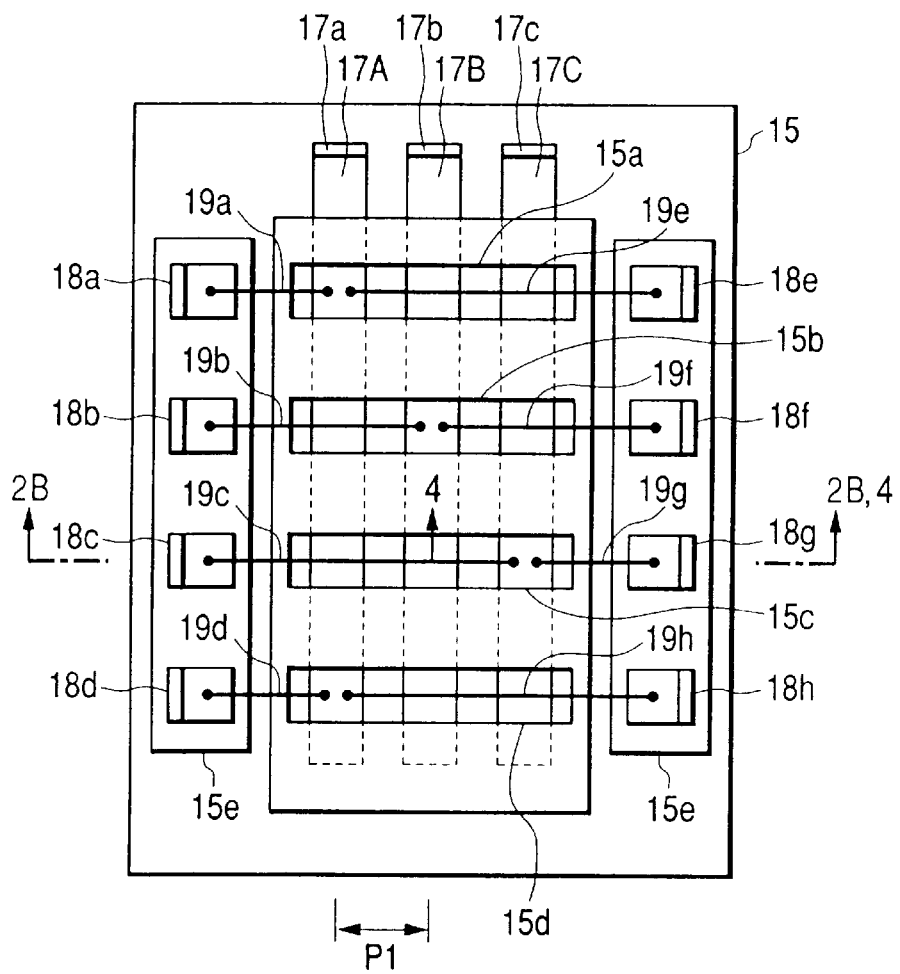
FIG. 2A is a plan view of the bus bar connection structure.
Figure 2B:
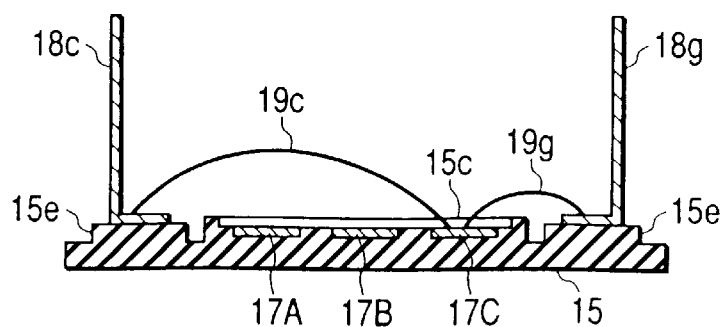
FIG. 2B is a side cross-sectional view taken on the line 2B—2B of FIG. 2A.

As shown in FIGS. 1 and 2, three bus bars 17A, 17B, 17C elongating straightly in the same direction are fixed on a quadrilateral synthetic resin insulation plate 15 with an interval P1 by the insert mold.

Four opening parts 15a to 15d are formed on the mold part covering the upper surface of the bus bars 17A, 17B, 17C in the direction orthogonal to the elongation direction of the bus bars 17A, 17B, 17C, with a predetermined interval in the elongating direction of the bus bars 17A, 17B, 17C so as to expose the bus bars 17A, 17B, 17C from the opening parts 15a to 15d.

Tub terminals 17a, 17b, 17c bent in the vertical direction (upward) are formed integrally on an end part of each bus bar 17A, 17B, 17C.

Slightly higher projection parts 15e are formed on the upper surface of the insulation member 15 on both sides of the bus bars 17A, 17C. Eight tub terminals 18a to 18h bent by 90 degrees in the vertical direction (upward) are fixed on the upper surface of the projection parts 15e so as to be aligned with the opening parts 15a to 15d of the insulation member 15 with the lower part thereof disposed inward with respect to the bus bars.

Figure 4:
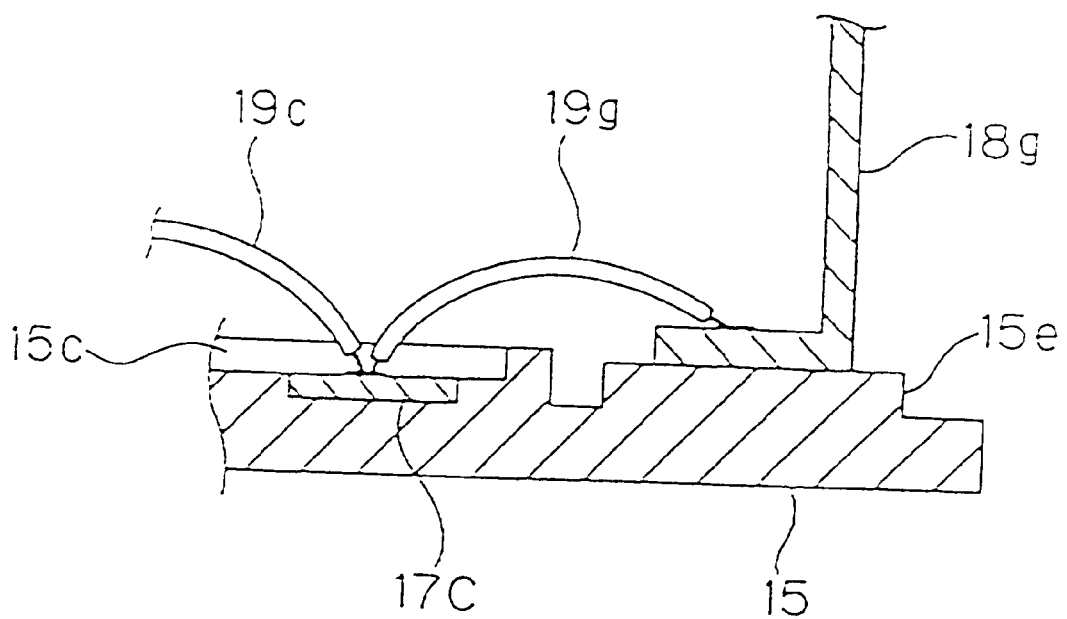
FIG. 4 is an enlarged side cross-sectional view corresponding to the line 4—4 of FIG. 2A.

The lower part of the tub terminals 18a to 18h and the bus bars 17A to 17C are bonded by wires 19a to 19h with an insulation coat at the opening parts (see FIG. 4).

Specifically, the tub terminal 18a and the bus bar 17A are bonded with the wire 19a at the opening part 15a. The tub terminal 18b and the bus bar 17B are bonded with the wire 19b at the opening part 15b. The tub terminal 18c and the bus bar 17C are bonded with the wire 19c at the opening part 15c. The tub terminal 18d and the bus bar 17A are bonded with the wire 19d at the opening part 15d.

Similarly, the tub terminal 18e and the bus bar 17A are bonded with the wire 19e at the opening part 15a. The tub terminal 18f and the bus bar 17B are bonded with the wire 19f at the opening part 15b. The tub terminal 18g and the bus bar 17C are bonded with the wire 19g at the opening part 15c. The tub terminal 18h and the bus bar 17A are bonded with the wire 19h at the opening part 15d.

Figure 3A:
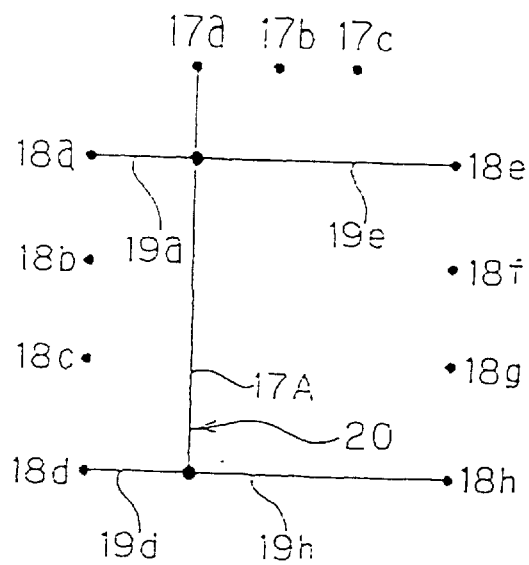
FIGS. 3A to 3C are circuit configuration diagrams.
Figure 3B:
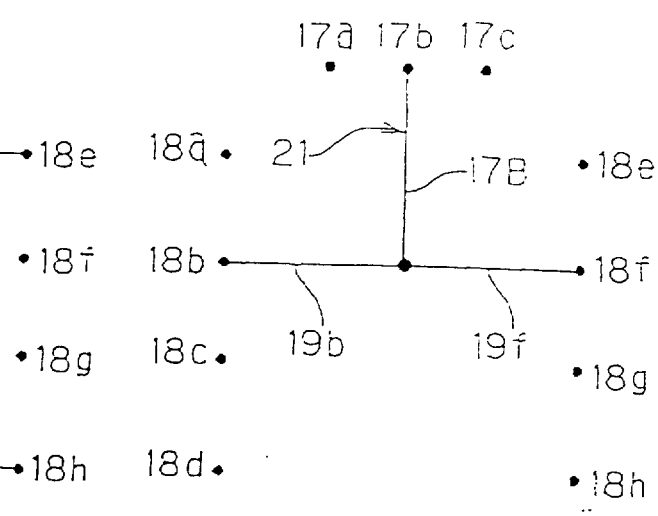
Figure 3C:
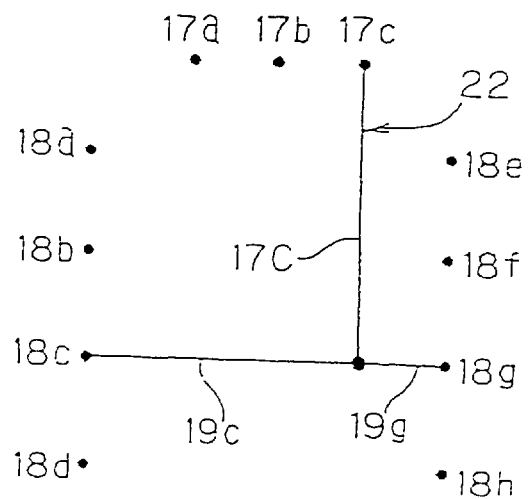

As a result, three circuits are formed independently as shown in FIGS. 3A to 3C in the tub terminals 17a to 17c of the bus bars 17 (A to C) and the tub terminals 18a to 18h.

That is, FIG. 3A shows a circuit 20 with the five tub terminals 17a, 18a, 18d, 18e, 18h connected electrically. FIG. 3B shows a circuit 21 with the three tub terminals 17b, 18b, 18f connected electrically. FIG. 3C shows a circuit 22 with the three tub terminals 17c, 18c, 18g connected electrically.

As the effect of the above-mentioned embodiment, the three circuits 20 to 22 can be formed independently by fixing the straight bus bars 17A to 17C with the tub terminals 17a to 17c on the insulation plate 15, fixing the tub terminals 18a to 18c at the side part with respect to the bus bars 17A to 17C, and bonding the tub terminals 18a to 18h and the bus bars 17A to 17C with the wires 19a to 19h with an insulation coat.

Therefore, unlike the conventional bus bar structure, since the insulation plate 15, the bus bars 17 (A to C) and the tub terminals 18a to 18h can be provided as completely common parts so that it is necessary only to arrange and fix the straight bus bars 17 (A to C) and the tub terminals 18a to 18h in the same shape in a combination, and to bond the bus bars 17 (A to C) and the tub terminals 18a to 18h with the wires 19a to 19h with the insulation coat. Unlike the conventional configuration, the bus bars need not be punched out with a press mold dedicated to each of different pattern shapes so that the production cost can be reduced.

Moreover, since any pattern shape can be dealt with only by changing the bonding positions, the number of the circuit design steps can be cut back drastically as well as the design change according to a slight circuit modification can be dealt with quickly so as to dramatically improve the flexibility.

In contrast, unlike the bus bar structure of the related art, since the dent part needs not be formed in each bus bar 17 (A to C), a mold for forming the dent part and the step for forming the dent part can be eliminated so as to further reduce the production cost.

Furthermore, since it is necessary only to fix the bus bars 17 (A to C) each having a simple straight shape without a dent part and the tub terminals 18a to 18h each having the same shape on the insulation member 15, the flexibility of the bus bars 17 (A to C) and the tub terminals 18a to 18h can be improved dramatically as well as the number of the assembly steps can be cut back.

Moreover, since any circuit can be dealt with only by changing the bonding position, the number of the circuit design steps can be cut back drastically as well as the design change according to a slight circuit modification can be dealt with quickly so as to further improve the flexibility.

Furthermore, since the wires 19a to 19h with the insulation coat are used for bonding, even in the case the adjacent wires are contacted, there is no risk of the short circuit.

Although the wires 19a to 19h with insulation coat are used by one piece at each position, plural pieces can be used for a part with a large current value.

Figure 5A:
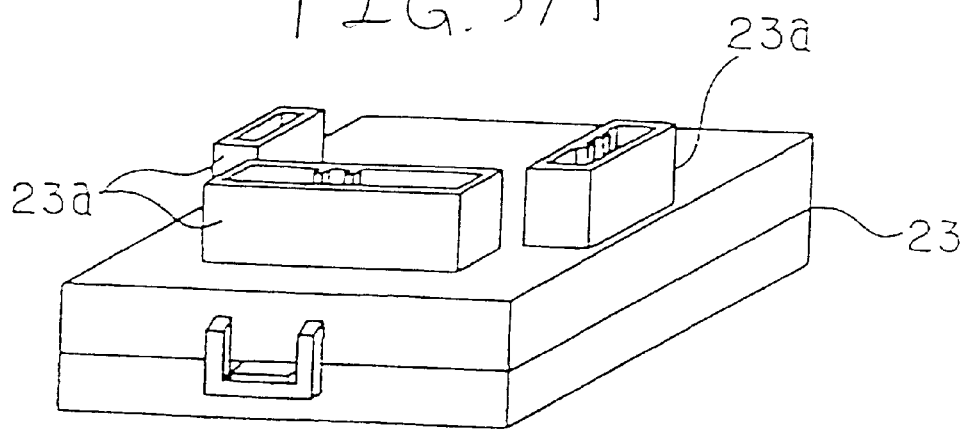
FIG. 5A is a perspective view of a vertically projecting type electric connection box.
Figure 5B:
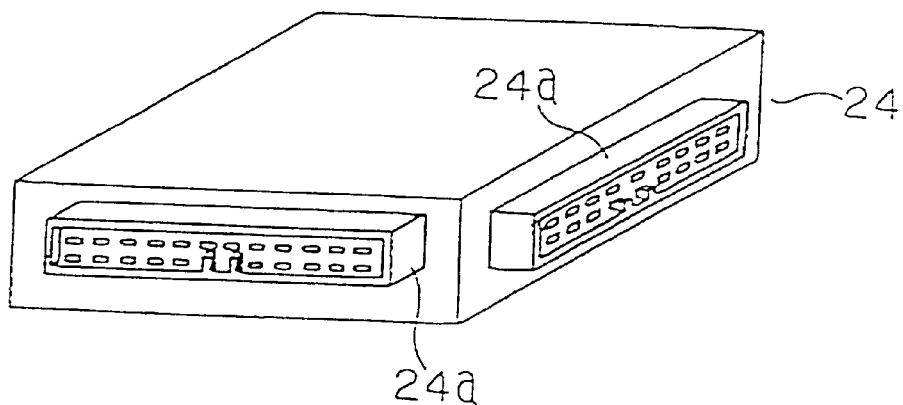
FIG. 5B is a perspective view of a laterally projecting type electric connection box.
Figure 5C:
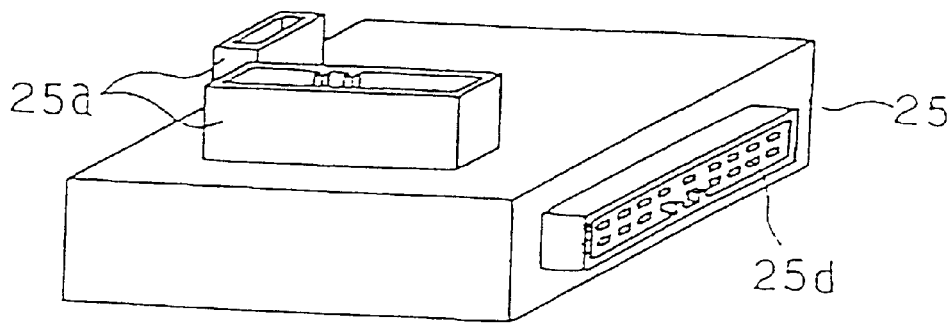
FIG. 5C is a perspective view of a vertically and laterally projecting mixed type electric connection box.

The above-mentioned embodiment provides a vertically projecting type with the tub terminals 17a to 17c, 18a to 18h projecting from a connector housing 23a on the upper surface of an electric connection box 23 as shown in FIG. 5A because the tub terminals 17a to 17c of the bus bars 17A to 17C and the tub terminals 18a to 18h are bent in the vertical direction (upward). In the case the tub terminals 17a to 17c, 18a to 18h are projected in the horizontal direction without bending, a laterally projecting type can be provided with the tub terminals 17a to 17c, 18a to 18h projecting from a connector housing 24a on the side surface of an electric connection box 24 as shown in FIG. 5B. Moreover, in the case the tub terminals 17a to 17c, 18a to 18h are projected from a connector housing 25a on the upper surface of an electric connection box and the tub terminals 17a to 17c, 18a to 18h are projected from a connector housing 25d on the side surface of the electric connection box 25, a mixed type of the vertically projecting type and the laterally projecting type can be provided as shown in FIG. 5C.

As apparent from the description given above, since a plurality of straight bus bars are fixed on an insulation plate as well as a plurality of tub terminals are fixed on the side part with respect to the bus bars, and the tub terminals and the bus bars are bonded with wires with an insulation coat, in addition to the same effects of the related art, unlike the related art, since a dent part needs not be formed on the bus bars so that a mold for forming the dent part and the step of forming the dent part can be eliminated, the production cost can further be reduced.

Moreover, since it is necessary only to fix the bus bars having a simple straight shape without the dent part and the tub terminals having the same shape on the insulation plate, the flexibility of the bus bars and the tub terminals can be improved dramatically as well as the number of assembly steps can be cut back.

Furthermore, since any bus bar circuit can be dealt with quickly only by changing the bonding position, the number of design steps of a circuit can be cut back drastically as well as the design change according to a slight circuit modification can be dealt with quickly so as to further improve the flexibility.

Still further, since the wires with an insulation coat are used for bonding, even in the case the adjacent wires are contacted, there is no risk of short circuit.

What is claimed is:

1. A connection structure for a circuit stored in an electric connection box, comprising:
   an insulation plate;
   a plurality of bus bars, portions of the plurality of bus bars fixed onto the insulation plate, elongating straightly in the same direction, and separated from each other;
   a plurality of tub terminals elongating in the direction perpendicular to the bus bar elongation direction, the plurality of tub terminals fixed to a side part with respect to the plurality of bus bars on the insulation plate and separated from each other; and a plurality of wires each having an insulation coat, the plurality of wires bonded to the plurality of tub terminals and the plurality of bus bars.

2. The connection structure as claimed in claim 1 further comprising a mold member disposed on the plurality of bus bars, the mold member defining a hole, wherein the plurality of wires are connected to the plurality of bus bars through the hole of the mold member.

3. A method for forming a circuit stored in an electric connection box, the method comprising:

fixing a plurality of bus bars elongating straightly in the same direction with an interval, on an insulation plate;

fixing a plurality of tub terminals elongating in the direction perpendicular to the bus bar elongation direction with an interval at the side part with respect to the bus bars on the insulation plate; and bonding the tub terminals and the bus bars with wires with an insulation coat.

\* \* \* \* \*